(12) United States Patent
Klütz et al.

(10) Patent No.: US 6,191,590 B1
(45) Date of Patent: Feb. 20, 2001

(54) DEVICE AND A PROCESS FOR MONITORING THE STATE OF CHARGE OF A BATTERY

(75) Inventors: Siegfried Klütz, Engelskirchen; Benedikt Faust, Plaidt, both of (DE)

(73) Assignee: Delphi Automotive Systems Deutschland GmbH, Wuppertal (DE)

(*) Notice: Under 35 U.S.C. 154(b), the term of this patent shall be extended for 0 days.

(21) Appl. No.: 09/088,887

(22) Filed: Jun. 2, 1998

(30) Foreign Application Priority Data

Jun. 14, 1997 (DE) .............................................. 197 25 204

(51) Int. Cl.$^7$ ..................... G01N 27/416; G08B 21/00; H02J 7/00
(52) U.S. Cl. ..................... 324/428; 324/426; 324/430; 340/636; 320/134
(58) Field of Search .................... 324/426, 427, 324/429, 430, 432, 433, 428; 340/636, 693.1, 693.2, 693.3, 693.4; 364/707; 341/176; 320/132, 134, 136

(56) References Cited

U.S. PATENT DOCUMENTS

| | | | | |
|---|---|---|---|---|
| 4,388,618 | * | 6/1983 | Finger | 324/428 |
| 4,740,754 | * | 4/1988 | Finger | 324/428 |
| 4,947,123 | * | 8/1990 | Minezawa | 324/427 |
| 4,968,941 | * | 11/1990 | Rogers | 324/428 |
| 5,179,340 | * | 1/1993 | Rogers | 324/428 |
| 5,404,106 |  | 4/1995 | Matsuda | 324/427 |
| 5,496,658 | * | 3/1996 | Hein et al. | 340/636 |
| 5,656,919 | * | 8/1997 | Proctor et al. | 324/427 |
| 5,686,815 | * | 11/1997 | Reipur et al. | 324/426 |
| 5,698,965 | * | 12/1997 | York | 320/132 |
| 5,825,155 | * | 10/1998 | Ito et al. | 324/433 |
| 5,903,131 | * | 5/1999 | Sekine et al. | 320/106 |

FOREIGN PATENT DOCUMENTS

| | | |
|---|---|---|
| 34 07 409 | 9/1985 | (DE) . |
| 3536111 | 5/1986 | (DE) . |
| 38 18 034 | 11/1989 | (DE) . |
| 98108574 | 11/1999 | (EP) . |
| 2278452 | 11/1994 | (GB) . |

* cited by examiner

*Primary Examiner*—Safet Metjahic
*Assistant Examiner*—Jermele M. Hollington
(74) *Attorney, Agent, or Firm*—Proskauer Rose LLP

(57) ABSTRACT

A device and method for determining the state of charge of a battery includes a microprocessor-controlled arithmetic unit connected in parallel to the terminal voltage of the battery. The arithmetic unit is selectively connectable with an ohmic reference resistance placed in parallel with a load resistance which is arranged in series with the battery, and with a capacitor chargeable or dischargeable via the arithmetic unit. The arithmetic unit is further capable of acquiring a value of the voltage drop across the capacitor. The arithmetic unit is operable in a first operating state in which it is disconnected from the reference resistance, and a second operating state in which the arithmetic unit is connected with the resistance. After the capacitor is charged to the terminal voltage of the battery, it is allowed to discharge. With the arithmetic unit in the first operating state, a first point in time marked by the voltage across the capacitor reaching a first threshold value is registered. In the second operating state, with the reference resistor connected to the arithmetic unit, a second point in time indicated by the voltage across the capacitor reaching a second threshold value is registered. The time difference between reaching the two threshold values represents a measured value proportional to the internal resistance, which in turn directly relates to the residual capacity of the battery.

10 Claims, 2 Drawing Sheets

DEVICE AND A PROCESS FOR MONITORING THE STATE OF CHARGE OF A BATTERY

BACKGROUND OF THE INVENTION

The invention relates to a device and a process for monitoring the capacity of a battery, in particular in key transmitters or remote controls such as in automotive applications, comprising measuring means for the terminal voltage and means for calculating the internal resistance of the battery as well as further means to determine the state of charge of the battery from the measured values.

A device of the type mentioned in the introduction is known from DE-OS 44 18 194. It is a system for determining the capacity of a chargeable storage battery of an automobile, in particular for determining the residual capacity (state of charge) of such a battery. From this printed publication it is known that the residual battery capacity is a function of electrolyte density, and that the electrolyte density can be correlated to the internal resistance of the battery and the discharge current of the battery. In this, the internal resistance of the battery is calculated by acquiring the terminal voltage in an uninterrupted state in which the connections to all electricity-consuming devices are interrupted, and a terminal voltage different from this in a selectively-connected state in which a connection is established to only one electricity-consuming device, as well as from the discharge current in this connected state. Acquisition of the residual capacity of the battery subsequently takes place at the temperature condition valid at the time, in connection with a table which shows the context between battery residual capacity, discharge current and internal resistance.

This process is expensive, because calculations in several steps must be carried out to do this, and in addition because switching off the battery from all electricity-consuming devices or selectively from individual electricity-consuming devices requires considerable switching action.

Apart from this, from DE-PS 34 07 409 a testing process for batteries is known in which the internal resistance of the battery is measured and from the comparison with a direct-current source of the same type as the device under test, of a determined state of charge, the state of charge of the device under test is determined. This process is expensive, because a second reference battery must always be at hand.

Finally, from DE-OS-38 18 034 a measuring device is known which directly indicates the internal resistance of batteries. Measurement is via a frequency-band-limited amplifier stage by pulsing of the battery as a test object with an alternating-current source.

On the other hand, from practical applications, processes are known which carry out measurements of a battery by monitoring the terminal voltage at the battery, because the voltage of a typical lithium cell at a constant load towards the end of its life progressively decreases. If however, a lithium cell is only occasionally subjected to a load, as is for example the case with a key transmitter, then the cell voltage always approaches the equilibrium value. In such a case, a method for estimating battery capacity which only refers to battery voltage is not suitable because, as a result of the temporary "recovery" of the battery, a fully-charged battery is simulated.

A further disadvantage of pure voltage measurement results from the strong temperature dependability of the voltage progression which is described by the Nernst equation:

$$\phi = \phi_0 + (R*T/z*F)*\ln(MWG)$$

Here, the electrode potential $\phi$ is given by the respective standard electrode potential $\phi_0$ and a further term into which the absolute temperature enters in a linear way. The voltage collapse observed towards the end of the service life thus also depends on the temperature and can only partially be used for assessing the capacity.

It is the object of the invention to develop a device or a process which make it possible to provide reliable information concerning the available cell capacity (state of charge), whereby in particular the capacity of a cell, even in cases of only occasional exposure to loads, is to be determined correctly. In addition, the measuring result should be as far as possible independent of temperature.

SUMMARY OF THE INVENTION

According to the invention, this object is solved in that parallel to the terminal voltage, a microprocessor-controlled arithmetic unit is connected parallel to the terminal voltage, with an ohmic resistance and a capacitance chargeable or dischargeable via the arithmetic unit being able to be connected to the said arithmetic unit, and with measuring and evaluation means for acquiring the voltage dropping at the capacitance being allocated to the arithmetic unit, in such a way that in a first operating state of the arithmetic unit, with non-connected resistance, a first point in time of reaching a first threshold value (resulting from the discharge time applicable to the capacitance in the first operating state) is registered; that in a second operating state of the arithmetic unit, with connected resistance, a second point in time of reaching a second threshold value is registered and that the time difference between the points in time of reaching the two threshold values on the characteristic of the voltage dropping at the capacitance is calculable and storable in the arithmetic unit as a measured value proportional to the internal resistance.

According to the process aspect of the invention, this object is met in that to determine a measured value proportional to the internal resistance by means of an arithmetic unit connected in parallel to the terminal voltage with a connectable ohmic resistance and an external capacitance, the voltage dropping a the capacitance is evaluated in such a way that in a first operating state of the arithmetic unit, with non-connected resistance, a first point in time of reaching a first threshold value (resulting from the discharge time applicable to the capacitance in the first operating state) is registered; that in a second operating state of the arithmetic unit, with connected resistance, a second point in time of reaching a second threshold value is registered and that the time difference between the points in time of reaching the two threshold values on the characteristic of the voltage dropping at the capacitance is calculable and storable in the arithmetic unit as a measured value proportional to the internal resistance.

One advantage of the solution according to the invention consists of the device or the process being independent of whether the battery is subject to constant load or only occasional load, because the internal resistance (cell resistance) determined according to the invention is independent of the type and manner of the load experienced. A further advantage of the invention is the large degree of temperature-independence of the internal resistance of the battery. Finally, by determining the internal resistance of the battery by means of a reference resistance, costs can be kept lower than is the case with determining the internal resistance by means of a reference voltage or a reference current.

According to a preferred embodiment of the invention, the charge/discharge circuit of the device according to the invention comprises a parallel connection of a resistor and a capacitor, with discharge of the capacitor taking place by way of this resistor.

A further preferred embodiment of the invention provides for a further resistor being connected in series to the charging device by means of which resistor the current is limited during charging of the charging device.

To further illustrate the invention, below an embodiment is described by means of drawings, in which like reference numerals designate the same elements:

DETAILED DESCRIPTION OF THE PREFERRED EMBODIMENT

Figure 1:
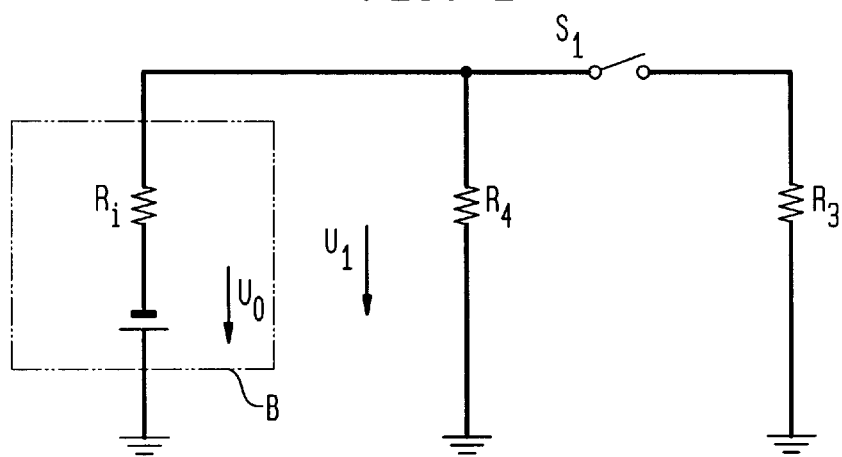
FIG. 1 shows a block diagram to illustrate the principle according to the invention.

FIG. 1 shows a battery B explained by a replacement circuit diagram from an ideal voltage source $U_0$ and an internal resistance $R_1$ connected in series. To signify an electricity-consuming device, outside the battery B a load resistance $R_4$ is connected in series with the battery. In addition a reference resistance $R_3$ can be switched in parallel on to or off from the load resistance $R_4$ by way of a switch S1.

Without reference resistance $R_3$, the voltage $U_1$ is measured at the battery B. As soon as the reference resistance $R_3$ is switched, the voltage drops from $U_1$ by $\Delta U_1$ to $U_1'$. The following calculation illustrates that the percentage voltage collapse $\Delta U_1/U_1$ of the terminal voltage during load with the reference resistance $R_3$ is approximately proportional to the internal resistance $R_i$ of the battery, provided that $R_3$ is low towards load resistance $R_4$:

$$U_1 = U_0 * \frac{R_4}{R_i + R_4} \quad (1)$$

$$U_1' = U_0 * \frac{R_4 \| R_3}{R_i + (R_4 \| R_3)}$$

$$\Rightarrow \frac{\Delta U_1}{U_1} = R_4 * \frac{R_i}{R_4 R_3 + R_4 R_i + R_3 R_i}$$

$$\Rightarrow R_i = R_3 * \frac{\Delta U_1}{U_1} * \frac{1}{1 - \frac{\Delta U_1}{U_1} - \frac{\Delta U_1}{U_1} * \frac{R_3}{R_4}}$$

$$\Rightarrow R_i \approx R_3 * \frac{\Delta U_1}{U_1} \quad \text{for} \quad \frac{\Delta U_1}{U_1} \ll 1, R3 \ll R4$$

If $R_3$ is selected as a fixed resistance, then determining the relationship $\Delta U_1/U_1$ is sufficient for measuring the internal resistance $R_i$ and thus for monitoring the battery capacity.

Figure 2A:
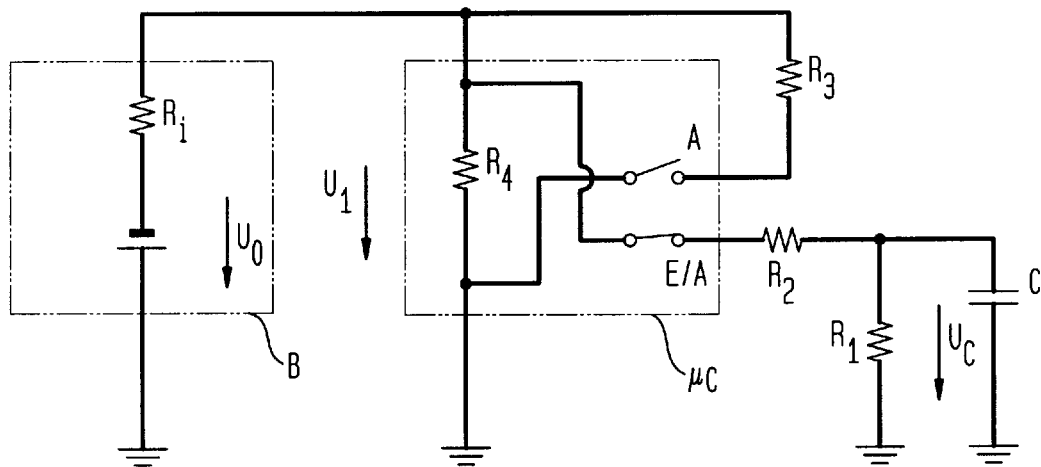
FIG. 2a shows a block diagram according to an embodiment of the invention.
Figure 2B:
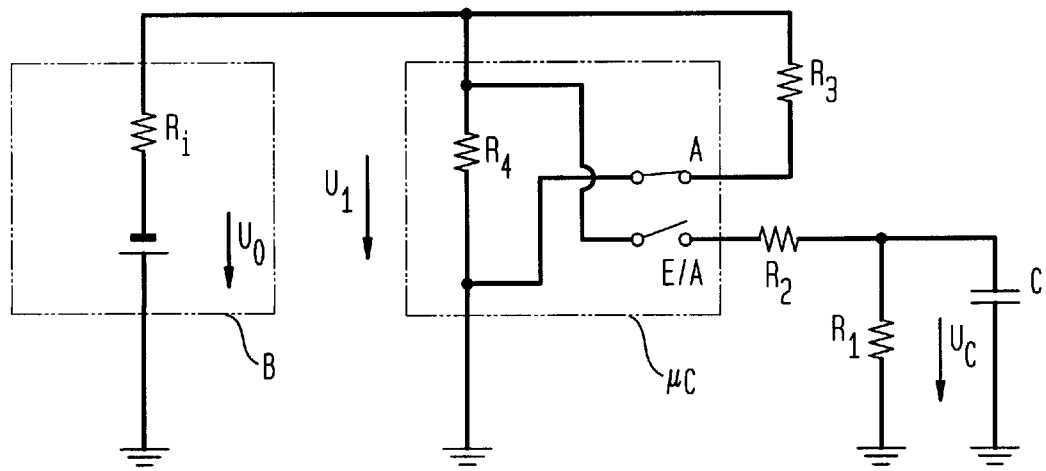
FIG. 2b shows a block diagram according to the embodiment of FIG. 2a, illustrating a second operating state of the arithmetic unit.

To determine this relationship, the circuit shown in FIGS. 2a and 2b is used which shows preferred embodiments according to the invention.

FIGS. 2a and 2b also show the battery B as a series connection of an ideal voltage source $U_0$ and an internal resistance $R_i$, with a microcontroller $\mu C$ being connected to the battery's terminal voltage. Furthermore, between the input and output of the microcontroller $\mu C$ and the ground, a series connection of a resistance $R_2$ and a parallel connection of a further resistance $R_1$ with a capacitor C are established. Finally, in the circuit, a reference resistance $R_3$ with the terminal voltage $U_1$ of the battery B and the input A of the microcontroller $\mu C$ is connected, with the resistance $R_3$, analogous to the view shown in FIG. 1, having to be low towards the parallel connection of the load resistance $R_4$ (not shown) to ensure that the equation (1) continues to apply. The micro controller $\mu C$ is in a position to connect both the reference resistance $R_3$ and the series connection of resistance $R_2$ with the parallel connection of the resistance $R_1$ with the capacitor C with the terminal voltage $U_1$ of the battery, or to interrupt this connection again.

The microcontroller operates as follows:

The microcontroller $\mu C$ continuously determines a switching threshold from High to Low, which is proportional with a factor k (k<1) to the operational voltage of the battery existing at a given time.

First the input/output E/A of the microcontroller $\mu C$ is switched as the output, resulting in the series connection of resistance $R_2$ and of parallel connection of the resistance $R_1$ with the capacitor C being present at the terminal voltage $U_1$ of the battery, B and the capacitor C charging, as shown in FIG. 2a.

Figure 3:
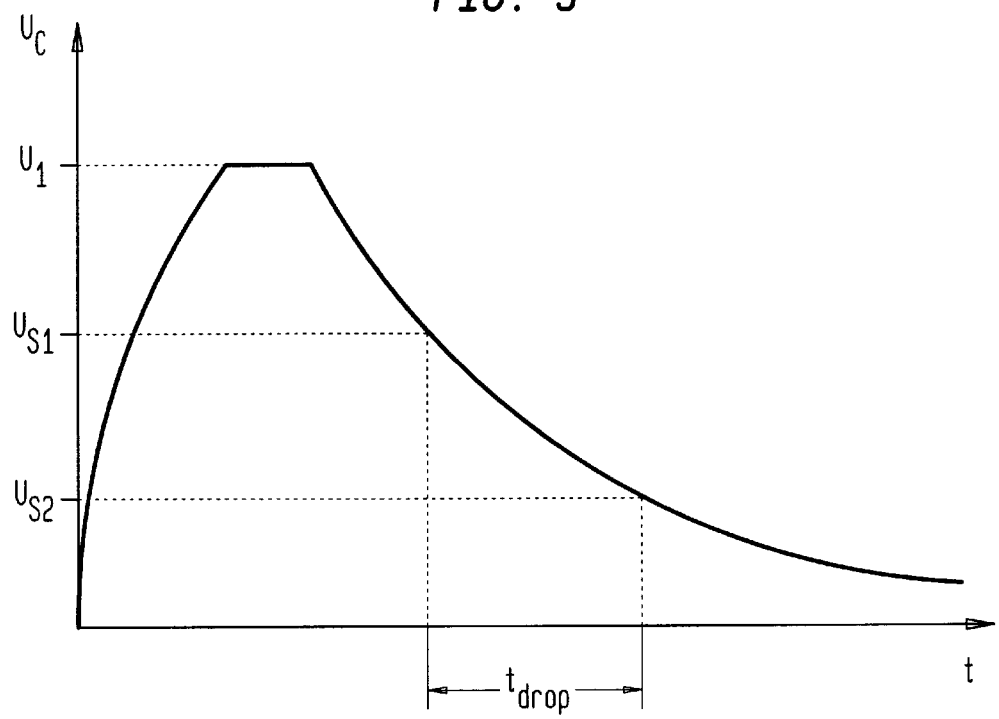
FIG. 3 shows the voltage progression Uc at the capacitance C according to the preferred embodiment in FIG. 2.

As soon as the no-load voltage $U_0$ is present at the capacitor C (plateau in FIG. 3), the input/output E/A of the microcontroller is switched as an input again as shown in FIG. 2b. As a result, the terminal voltage of the battery B is no longer present at the series connection, and the capacitor C discharges by way of resistance $R_1$. The voltage $U_C$ at the capacitor C thus drops according to the exponential function shown in FIG. 3.

Once the voltage at the capacitor C reaches the switching threshold $U_{S1}$ (=k*$U_1$), this is registered by the microcontroller $\mu C$ and instantaneously switched to the additional load resistance $R_3$. Due to the voltage collapse at the battery, the switching threshold on the characteristic shown in FIG. 3 drops by $\Delta U_S$ to $U_{S2}$ (=k*$U_1'$) so that a second transition can take place.

The time $t_{drop}$ (see FIG. 3) is measured by the micro controller $\mu C$. The following applies to this time:

$$U_{S2} = U_{S1} * e^{-\frac{t_{drop}}{R_1 * C}} \Rightarrow \ln\left(\frac{U_{S2}}{U_{S1}}\right) = -\frac{t_{drop}}{R_1 * C} \quad (2)$$

$$t_{drop} = -R_1 * C * \ln\left(1 - \frac{\Delta U_S}{U_{S1}}\right) \text{ with } \Delta U_S = U_{S1} - U_{S2}$$

The logarithm occurring can be developed sequentially, with the following applying:

$$\ln(1 + x) = x - \frac{1}{2}x^2 + \frac{1}{3}x^3 - \frac{1}{4}x^4 + \ldots \text{ for } -1 < x < 1$$

If one disregards order components higher than one, of this sequence, the following is obtained, provided there is a relatively small voltage collapse:

$$t_{drop} \approx R_1 * C * \frac{\Delta U_S}{U_{S1}} \quad (3)$$

According to the assumption, each of the threshold voltages is proportional to the operating voltage with a factor of (k) (k<1), i.e. as follows:

$$t_{drop} \approx R_1 * C * \frac{U_{S1} - U_{S2}}{U_{S1}} \quad (4)$$

$$= R_1 * C * \frac{k * U_1 - k^* U_2}{k * U_1}$$

$$= R_1 * C * \frac{\Delta U_1}{U_1}$$

with a reduction to the unknown proportionality factor k. Thus the required relationship $\Delta U_1/U_1$ was determined.

Overall, the following result is obtained in equations (1) and (4) for the internal resistance $R_i$ of the battery:

$$R_i \approx t_{drop} * \frac{R_3}{R_1 * C} \quad (5)$$

Since the measured time $t_{drop}$ in the microcontroller is present as a counting result, by means of a comparator specified in the microprocessor it is easy to detect a weak battery if the measured value $t_{drop}$ is compared with a desired value (pre-set value).

What is claimed is:

1. A device for determining a state of charge of a battery, comprising:

a microprocessor-controlled arithmetic unit connected across the battery such that a terminal voltage of the battery is measurable;

an ohmic reference resistance selectively connectable to said arithmetic unit, said arithmetic unit being switchable between a first operating state in which the reference resistance is disconnected from said arithmetic unit, and a second operating state in which the reference resistance is connected across the battery via the arithmetic unit;

a capacitance connectable to said arithmetic unit and being alternately chargeable and dischargeable via the arithmetic unit, said arithmetic unit being capable of measuring and evaluating a voltage drop across the capacitance, said arithmetic unit, while in said first operating state registering a first point in time corresponding to the voltage drop reaching a first threshold value resulting from a discharge time applicable to the capacitance, and while in the second operating state registering a second point in time corresponding to said voltage drop reaching a second threshold value, the arithmetic unit measuring the time difference between points in time of reaching the first and second threshold values, said second threshold value being based upon the terminal voltage while said arithmetic unit is in said second operating state, whereby said time difference represents a measured value proportional to an internal resistance of the battery.

2. A device according to claim 1, further comprising a parallel resistance which is connected in parallel to the capacitance.

3. A device according to claim 1, further comprising a limiting resistance interconnected between the arithmetic unit and the capacitance to limit a charging current.

4. A device according to claim 1, wherein the arithmetic unit is further adapted for storing a predefinable desired value for the time difference between the occurrence of the first and second threshold values, said desired value being compared by the arithmetic unit with a measured value of the time difference such that when the measured value exceeds the desired value, an unacceptably low residual state of charge is assumed to exist.

5. A method of determining a state of charge of a battery, comprising the steps of:

connecting an arithmetic unit across the battery such that a terminal voltage of the battery is measurable by said arithmetic unit, said arithmetic unit being switchable between a first operating state in which a reference resistance is disconnected from said arithmetic unit, and a second operating state in which the reference resistance is connected across the battery via the arithmetic unit and placed in parallel with a load resistance, said load resistance being arranged in series with the battery;

measuring the terminal voltage with the arithmetic unit while in said first operating state;

determining a first threshold voltage based upon said terminal voltage while in said first operating state;

selectively connecting the terminal voltage of the battery via the arithmetic unit with a capacitor to charge the capacitor while in said first operating state;

disconnecting said capacitor from said terminal voltage and allowing said capacitor to discharge;

determining a first point in time when a capacitor voltage drops below said first threshold voltage and switching said arithmetic unit to said second operating state;

measuring the terminal voltage with the arithmetic unit while in said second operating state;

determining a second threshold voltage based upon said terminal voltage while in said second operating state;

determining a second point in time when the capacitor voltage drops below said second threshold voltage; and correlating an internal resistance of the battery indicative of the state of charge with a time period between said first point in time and said second point in time.

6. A method according to claim 5, wherein the connection to the reference resistance takes place simultaneously as the first threshold voltage is reached.

7. A method according to claim 5, wherein the reference resistance has an ohmic value much smaller than the load resistance.

8. A method of determining a state of charge of a battery, comprising the steps of:

applying a terminal voltage of the battery to be monitored to a parallel circuit of a resistance and a capacitor having a capacitance, such that the capacitor is charged;

disconnecting the parallel connection of the resistance and the capacitor from the terminal voltage whereby the capacitor discharges through the resistance;

determining a first threshold voltage;

determining a first point in time at which a voltage across the capacitor falls below the first threshold voltage;

storing said first point in time and, concurrently therewith, additionally applying a reference resistance to the terminal voltage;

determining a second threshold voltage based upon a value of the terminal voltage with said reference resistor applied;

determining a second point in time at which the voltage across the capacitor falls below the second threshold voltage;

determining an internal resistance of the battery from the time difference between the first and the second point in time at which the voltage dropped below the first and the second threshold values, respectively, from the resistance, the reference resistance and the capacitance of the capacitor, according to an equation:

$$R_i = t_{drop} * R_3 / (R_1 * C) \text{ where:}$$

$R_i$ is the internal resistance of the battery, $t_{drop}$ is the time difference, $R_1$ is the resistance, $R_3$ is the reference resistance and C is the capacitance; and determining the state of charge of the battery based upon the internal resistance.

9. A method according to claim 8, wherein the first threshold voltage is determined based upon the terminal voltage prior to application of the reference resistor.

10. A method according to claim 8, wherein both the first threshold and the second threshold voltages are determined by multiplying respective values of the terminal voltage without the reference resistor applied and with the reference resistor applied, respectively, by a same constant having a value less than one.

* * * * *